United States Patent [19]

Takebayashi

[11] Patent Number: 4,682,408
[45] Date of Patent: Jul. 28, 1987

[54] METHOD FOR MAKING FIELD OXIDE REGION WITH SELF-ALIGNED CHANNEL STOP IMPLANTATION

[75] Inventor: Koji Takebayashi, Takatsuki, Japan

[73] Assignee: Matsushita Electronics Corporation, Kadoma, Japan

[21] Appl. No.: 846,736

[22] Filed: Apr. 1, 1986

[30] Foreign Application Priority Data

Apr. 1, 1985 [JP] Japan .................................. 60-68727

[51] Int. Cl.⁴ ..................... H01L 21/76; H01L 21/94; H01L 21; H01L 72
[52] U.S. Cl. .................................. 29/576 W; 29/578; 29/576 B; 29/577 C; 29/571; 148/DIG. 85; 148/DIG. 70; 357/49; 357/52
[58] Field of Search ................... 29/576 W, 578, 571; 148/1.5, DIG. 85; 156/648; 357/49, 52

[56] References Cited

U.S. PATENT DOCUMENTS

| | | | |
|---|---|---|---|
| 3,891,469 | 6/1975 | Moriyama et al. | 357/49 |
| 4,502,208 | 3/1985 | McPherson | 29/578 |
| 4,570,325 | 2/1986 | Higuchi | 29/571 |

FOREIGN PATENT DOCUMENTS

| | | | |
|---|---|---|---|
| 0134443 | 8/1983 | Japan | 29/576 W |
| 0092547 | 5/1984 | Japan | 29/576 W |
| 0136935 | 8/1984 | Japan | 29/589 |

Primary Examiner—Brian E. Hearn
Assistant Examiner—Tom Thomas
Attorney, Agent, or Firm—Cushman, Darby & Cushman

[57] ABSTRACT

A process is described for forming semiconductor device which include forming step of coating of silicon oxide derivative before ion implanting step: The coating prevents unnecessary extention of channel stop regions thus produces high speed and high current drive ability of produced semiconductor device.

4 Claims, 7 Drawing Figures

METHOD FOR MAKING FIELD OXIDE REGION WITH SELF-ALIGNED CHANNEL STOP IMPLANTATION

FIELD OF THE INVENTION AND RELATED ART STATEMENT

1. Field of the Invention

The present invention relates to semiconductor device processing.

2. Description of the Related Art

In the fabrication of insulated gate semiconductor integrated circuits, particularly in ultra large scale integrated circuit, for separating formed elements each other a field insulating regions are usually formed by method of local oxidation of silicon (LOCOS method).

Referring now to FIGS. 1A and 1B, a prior process for making semiconductor integrated circuits is elucidated. In FIG. 1A, a silicon dioxide layer 3 is formed over a substrate 1. Then, ion implanted regions 4 are formed by implanting impurities by using silicon nitride layers 2 as a mask. Then, selective local oxidation is carried out to form the field insulating regions 5 with their underlying channel stop regions 4 (see FIG. 1B). The P+ channel stop regions 4 are provided for obtaining high gate threshold voltage.

In the prior process, the formed channel stop regions 4 are extended to n+ source and n+ drain regions 15. P+-n+ junctions are therefore formed therebetween and therefore junction capacitance there increases. Such higher capacitance reduces the operation speed of MOS circuits constituted thereof.

The channel stop regions 4 are also extended to underlying part of insulation layers 12 which are provided under the gate electrodes 13, and thus decrease gate width. Such narrowed gate width $W_1$ reduces current drive ability.

OBJECT AND SUMMARY OF THE INVENTION

It is a first object of this invention to provide an improved method for making superior semiconductor device. It is a second object of the invention to prevent the extensions of the channel stop regions formed under the channel stop regions.

These and other objects are achieved by method for making semiconductor device in accordance with the invention comprises the steps of:
  forming a film of silicon dioxide on a semiconductor substrate of one conductivity,
  forming a film of silicon nitride on the film of silicon dioxide,
  selectively removing the film of silicon nitride to make an opening to expose surface of the film of silicon oxide,
  forming a coating of a silicon oxide derivative on all the surface of the substrate,
  heat-treating the substrate thereby to change the coating to film of silicon dioxide,
  implanting ions of the one conductivity into the substrate through the films of silicon dioxide thereby to form an ion implanted region,
  removing the film of silicon dioxide changed from said coating,
  selectively oxidizing the substrate, by using the film of silicon nitride as a mask, to form selectively oxidized region as isolation region having channel stopper region only under the selectively formed oxide film.

These and other objects are achieved in accordance with the invention.

While the novel features of the invention are set forth with particularity in the appended claims, the invention, both as to organization and content, will be better understood and appreciated, along with other objects and features thereof, from the following detailed description taken in conjunction with the drawings.

DESCRIPTION OF THE PREFERRED EMBODIMENTS

A semiconductor process described here is particularly suitable in ultra large scale integrated circuit. In the following description, numerous specific details, such as specific layer thicknesses, etc., are set forth in order to provide a thorough understanding of the presently preferred process. However, it will be obvious to one skilled in the art that the invention may be practiced without these specific details.

Also in the following description, the formation of n-channel transistors in metal-oxide-semiconductor(-MOS) integrated circuits is described, wherein transistors are fabricated on a p-type singlecrystalline silicon substrate. It will be apparent to one skilled in the art that the process may be employed for the formation of p-channel transistors and with other technologies.

Figure 1A:
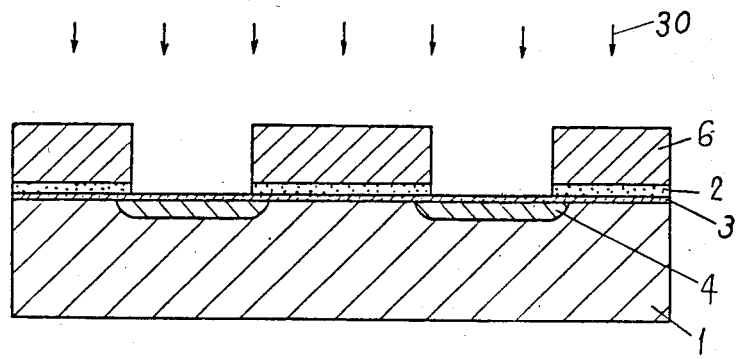
FIG. 1A is the cross-sectional elevation view of the substrate which includes the silicon dioxide layer a silicon nitride layer, masking member and ion implanting regions, in the prior art process.
Figure 1B:
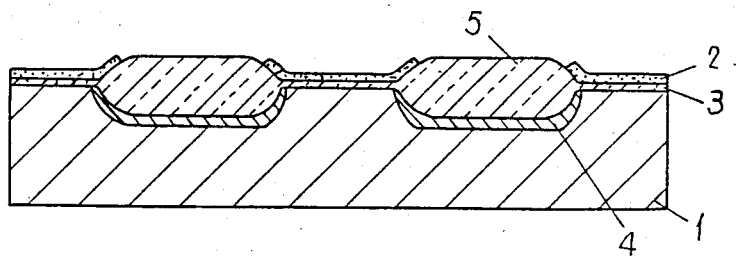
FIG. 1B illustrates the substrate of FIG. 1A after the selective local oxidation step.
Figure 2A:
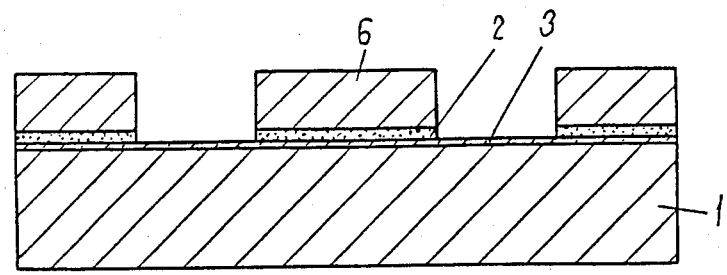
FIG. 2A is a cross-sectional elevation view of a substrate which includes a silicon dioxide layer, a silicon nitride layer and masking member, in a process in accordance with present invention.

Referring now to FIG. 2A, a section of a substrate 1 is illustrated. In the present preferred process, the substrate 1 is a low conductivity substrate and is doped with a p-type dopant. A silicon dioxide layer 3 is formed by thermally oxidizing a surface of the substrate 1. A silicon nitride layer 2 as antioxidization layer is formed on the silicon dioxide layer 3 by C.V.D. (chemical vapor deposition) method. By way of example, the silicon dioxide layer 3 is approximately 50 nm thick, and the silicon nitride layer 2 is approximately 120 nm thick. Then, the silicon nitride layer 2 is patterned by using a photo-resist layer 6 as a mask.

Figure 2B:
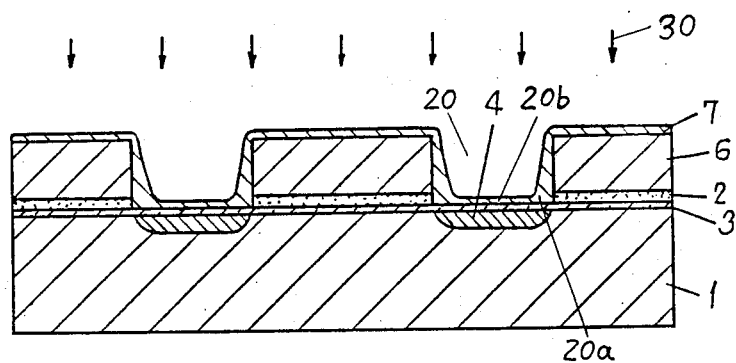
FIG. 2B illustrates the substrate of FIG. 2A with ion implanted regions and a silanol film.
Figure 2C:
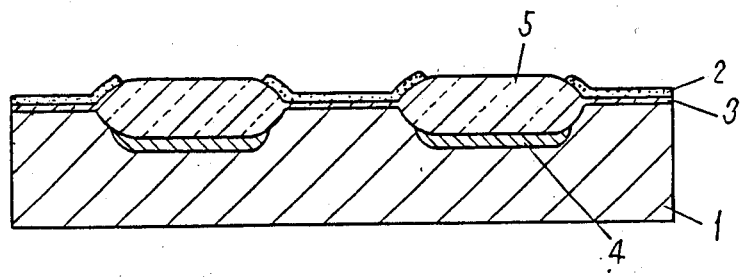
FIG. 2C illustrates the substrate of FIG. 2B after a selective local oxidation step.

Next, as shown in FIG. 2B, a silanol film 7 which consists of silanol ($H_3SiOH$) as principal ingredient is formed over the resist layer 6 and the substrate 1. The silanol film 7 can be formed by spine coating method in such a shape that thickness of the silanol film 7 in an edge 20a of an opening 20 is thicker than that in a center part 20b of the opening 20, when the silanol has viscosity of about 1 cp (centi poise). Then, the silanol film 7 is heat-treated in about 300° C. for 20 minutes to form a silicon dioxide layer 7. The formed silicon dioxide layer 7 has thicker part in the edge 20a of the opening 20 and thinner part in the center 20b of the opening 20. By way of example, the thinner part 20b is about 100 nm thick.

As shown in FIG. 2B, the substrate 1 is subject to impurity ion implantation as illustrated by lines 30, to form an ion implanting regions 4. Impurity ions are implanted into the substrate 1 through the center parts 20b of the openings 20, because in this part thicknesses of the silicon dioxide layer 7 and the silicon dioxide layer 3 are thinner (about 150 nm) than the edge part 20a. The thicker part 20a of the silicon dioxide layer 7 prevents implantation the impurity ions into the substrate 1. Therefore, unnecessary spreading of the ion implanting regions 4 can be prevented.

Figure 3:
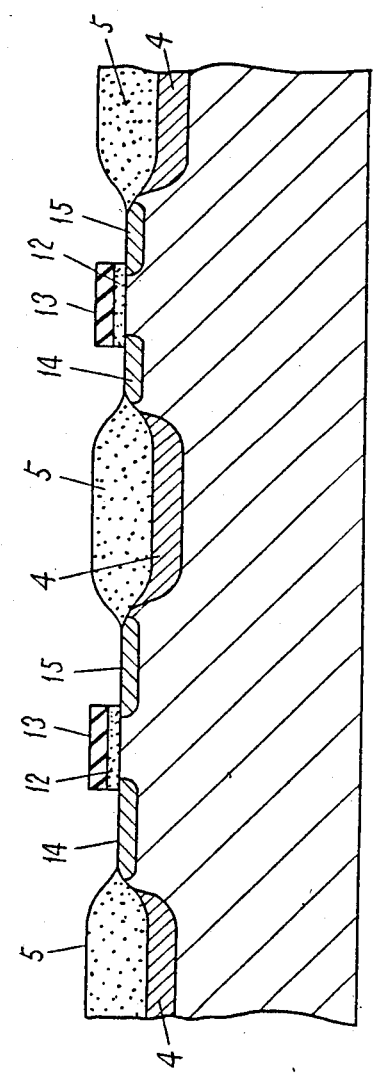
FIG. 3 illustrates the substrate of FIG. 2C with the source regions, the drain regions and the gate electrodes.
Figure 4:
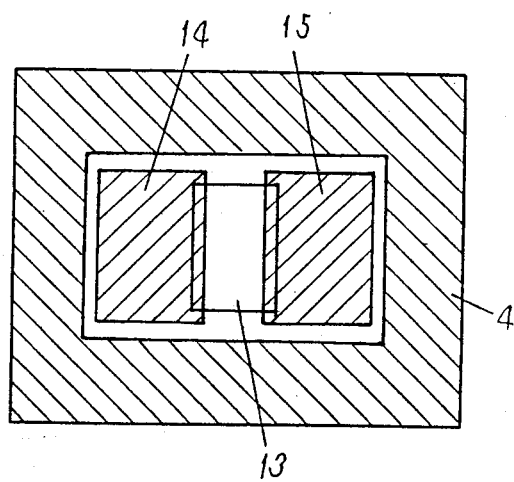
FIG. 4 is the plan view of the substrate of FIG. 3.

Next, the resist layer 6 and the silicon dioxide layer 7 are removed by known process. Then, LOCOS method are used to form the field insulating regions 5 with their underlying channel stop regions 4. Thereafter, by way of common process, MOS-LSI is produced. As shown in FIGS. 3 and 4, the channel stop regions 4 are separated from the drain regions 14 and the source regions 15 and are not extended to the underlaying part of the insulation layers 12 provided under gate electrodes 13.

The channel stop regions 4 are not formed over the edge of the field insulating regions 5 (see FIG. 3). Therefore, undesirable junction capasitances between source and drain regions 14, 15 and the channel stop regions 4 are not increased. Such low capasitances gives high speed to produced semiconductor.

Further, the gate width is not decreased since the channel stop region 4 are not extended to underlying part of insulation layers 12 (see FIG.4).

As has been described, the method for making semiconductor device in accordance with the present invention give high speed and high current drive ability to produced semiconductor device, as a result of introducing the forming step of the silanol film before the ion implanting step.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

What is claimed is:

1. Method for making semiconductor device comprising the steps of:
   forming a film of silicon dioxide on a semiconductor substrate of one conductivity,
   forming a film of silicon nitride on said film of silicon dioxide,
   selectively removing said film of silicon nitride to make an opening to expose surface of said film of silicon oxide,
   forming a coating of a silicon oxide derivative on all the surface of said substrate,
   heat-treating the substrate thereby to change said coating to film of silicon dioxide,
   implanting ions of said one conductivity into said substrate through said films of silicon dioxide thereby to form an ion implanted region,
   removing said film of silicon dioxide changed from said coating,
   selectively oxidizing said substrate by using said film of silicon nitride as a mask, to form selectively oxidized region as isolation region having channel stopper region only under said selectively formed oxide film.

2. Method for making semiconductor device in accordance with claim 1,
   said silicon oxide derivative is silanol film which consists of silanol as chief ingredient.

3. Method for making semiconductor device comprising the steps of:
   forming a film of silicon dioxide on a semiconductor substrate of one conductivity,
   forming a film of silicon nitride on said film of silicon dioxide,
   forming a photo resist on said film of silicon nitride,
   selectively removing said film of silicon nitride to make an opening to expose surface of said film of silicon oxide by using said photo resist as a mask,
   forming a coating of a silicon oxide derivative on all the surface of said substrate,
   heat-treating the substrate thereby to change said coating to film of silicon dioxide,
   implanting ions of said one conductivity into said substrate through said films of silicon dioxide thereby to form an ion implanted region,
   removing said photo resist and said film of silicon dioxide changed from said coating,
   selectively oxidizing said substrate by using said film of silicon nitride as a mask, to form selectively oxidized region as isolation region having channel stopper region only under said selectively formed oxide film.

4. Method for making semiconductor device in accordance with claim 3,
   said silicon oxide derivative is silanol film which consists of silanol as chief ingredient.

* * * * *